(12) United States Patent
Cirillo

(10) Patent No.: US 10,382,245 B1
(45) Date of Patent: Aug. 13, 2019

(54) METHOD FOR COMPRESSING IQ MEASUREMENT DATA

(71) Applicant: Rohde & Schwarz GmbH & Co. KG, Munich (DE)

(72) Inventor: Luke Cirillo, Poing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/020,600

(22) Filed: Jun. 27, 2018

(51) Int. Cl.
  *H03M 7/30* (2006.01)
  *H04L 27/34* (2006.01)
  *G10L 19/028* (2013.01)

(52) U.S. Cl.
  CPC ........ *H04L 27/3405* (2013.01); *G10L 19/028* (2013.01); *H03M 7/6041* (2013.01)

(58) Field of Classification Search
  CPC .......................... H04L 27/3405; G10L 19/028
  USPC .......................................... 375/240, 241–254
  See application file for complete search history.

(56) References Cited

U.S. PATENT DOCUMENTS

| | | | | |
|---|---|---|---|---|
| 4,823,363 A * | 4/1989 | Yoshida | ................... | H04L 7/027 370/516 |
| 5,412,741 A * | 5/1995 | Shapiro | ................... | H03M 7/30 358/1.9 |
| 5,852,389 A * | 12/1998 | Kumar | ................... | H03C 7/027 332/103 |
| 5,901,178 A * | 5/1999 | Lee | ......... | G06T 1/0028 375/240 |
| 6,647,128 B1 * | 11/2003 | Rhoads | ................ | G06K 7/1417 382/100 |
| 7,006,568 B1 * | 2/2006 | Gu | ......... | H04N 19/46 348/472 |
| 7,016,426 B1 * | 3/2006 | Balz | ..................... | H04L 27/2647 332/103 |
| 7,136,010 B2 * | 11/2006 | Cirillo | ..................... | G01S 7/003 342/25 R |
| 7,145,957 B1 * | 12/2006 | Balz | ..................... | H04L 27/2647 375/261 |
| 7,394,410 B1 * | 7/2008 | Wegener | ................. | H03M 7/30 341/50 |
| 7,649,484 B1 * | 1/2010 | Wegener | ................. | H03M 7/30 341/155 |
| 7,876,252 B1 * | 1/2011 | Wegener | ................. | H03M 7/30 341/155 |
| 7,978,759 B1 * | 7/2011 | Sarrigeorgidis | ..... | H04B 7/0413 375/231 |

(Continued)

*Primary Examiner* — James M Perez
(74) *Attorney, Agent, or Firm* — Christensen O'Connor Johnson Kindness PLLC

(57) ABSTRACT

A method for compressing IQ measurement data obtained from a signal is described. Within the IQ measurement data, at least one block of IQ data is determined where redundancy of the respective data can be exploited. The IQ data of the at least one block is transformed into a transform domain where redundancy of the respective data can be exploited. Transform coefficients obtained in the transform domain are determined and assessed with regard to a predefined criteria so as to determine whether the transform coefficients comprise significant information. Only the IQ data assigned to transform coefficients having significant information is stored along with indices in the transform domain indicating where the respective transform coefficients occur in the transform domain.

16 Claims, 3 Drawing Sheets

(56) References Cited

U.S. PATENT DOCUMENTS

| | | | | |
|---|---|---|---|---|
| 8,154,985 B1* | 4/2012 | Smith, Jr. | H03M 7/3068 | 370/210 |
| 8,260,989 B2* | 9/2012 | Etkin | H04W 52/0219 | 710/68 |
| 8,514,950 B2* | 8/2013 | Aoki | H04B 7/155 | 375/242 |
| 8,670,506 B2* | 3/2014 | Perthold | H04B 17/23 | 342/192 |
| 8,837,523 B2* | 9/2014 | Song | H04L 69/22 | 370/470 |
| 8,867,659 B2* | 10/2014 | Liebl | H04L 27/183 | 375/261 |
| 8,989,257 B1* | 3/2015 | Akhter | H03M 7/3059 | 375/240 |
| 9,060,287 B2* | 6/2015 | Mellein | H04W 24/02 | |
| 9,081,035 B2* | 7/2015 | Deutinger | G01R 21/04 | |
| 9,363,698 B2* | 6/2016 | Cirillo | G01R 13/0263 | |
| 9,401,153 B2* | 7/2016 | Sharma | G10L 19/018 | |
| 9,485,688 B1* | 11/2016 | Akhter | H03M 7/3091 | |
| 9,553,954 B1* | 1/2017 | Akhter | H04L 69/04 | |
| 9,775,045 B2* | 9/2017 | Li | H04W 16/02 | |
| 9,810,716 B2* | 11/2017 | Cirillo | G01R 13/0236 | |
| 10,018,708 B2* | 7/2018 | Lagler | G01S 7/4004 | |
| 10,026,410 B2* | 7/2018 | Gurijala | G10L 19/018 | |
| 10,057,777 B2* | 8/2018 | Li | H04W 16/02 | |
| 10,088,554 B2* | 10/2018 | Cirillo | G01R 23/20 | |
| 10,107,896 B2* | 10/2018 | Cirillo | G01S 7/4052 | |
| 2003/0156644 A1* | 8/2003 | Song | H04N 5/145 | 375/240.13 |
| 2004/0017307 A1* | 1/2004 | Cirillo | G01S 7/295 | 342/25 R |
| 2004/0160353 A1* | 8/2004 | Cirillo | G01S 7/003 | 342/25 R |
| 2007/0027656 A1* | 2/2007 | Baraniuk | G06K 9/0057 | 702/189 |
| 2008/0175422 A1* | 7/2008 | Kates | G10H 1/125 | 381/316 |
| 2009/0290632 A1* | 11/2009 | Wegener | H03M 7/30 | 375/240 |
| 2010/0095191 A1* | 4/2010 | Mudulodu | H03M 13/2782 | 714/799 |
| 2010/0329314 A1* | 12/2010 | Liebl | H04L 27/183 | 375/219 |
| 2012/0047378 A1* | 2/2012 | Etkin | H04W 52/0219 | 713/320 |
| 2012/0190389 A1* | 7/2012 | Hui | H03M 7/3073 | 455/500 |
| 2012/0243468 A1* | 9/2012 | Hui | H04B 7/024 | 370/328 |
| 2013/0002284 A1* | 1/2013 | Deutinger | G01R 1/06772 | 324/755.01 |
| 2013/0322528 A1* | 12/2013 | Fuchie | H04N 19/172 | 375/240.07 |
| 2013/0346005 A1* | 12/2013 | Cirillo | G01R 13/0236 | 702/67 |
| 2014/0108020 A1* | 4/2014 | Sharma | G10L 19/018 | 704/500 |
| 2014/0254405 A1* | 9/2014 | Mellein | H04W 24/02 | 370/252 |
| 2014/0370883 A1* | 12/2014 | Cirillo | G01R 13/0263 | 455/422.1 |
| 2015/0156284 A1* | 6/2015 | Akhter | H04L 69/04 | 370/477 |
| 2016/0033624 A1* | 2/2016 | Lagler | G01S 7/4004 | 342/173 |
| 2016/0080027 A1* | 3/2016 | Agata | H04W 16/26 | 370/329 |
| 2016/0084940 A1* | 3/2016 | Cirillo | G01R 23/20 | 342/21 |
| 2016/0329631 A1* | 11/2016 | Rheinfelder | H01Q 1/246 | |
| 2017/0059617 A1* | 3/2017 | Cirillo | G01R 13/0218 | |
| 2017/0079059 A1* | 3/2017 | Li | H04W 16/02 | |
| 2017/0133022 A1* | 5/2017 | Gurijala | G10L 19/018 | |
| 2017/0138992 A1* | 5/2017 | Bresser | G01R 23/165 | |
| 2017/0212216 A1* | 7/2017 | Cirillo | G06G 7/78 | |
| 2017/0238361 A1* | 8/2017 | Pawar | H03M 7/40 | 455/561 |
| 2017/0288695 A1* | 10/2017 | Feng | H03M 7/3082 | |
| 2017/0339567 A1* | 11/2017 | Li | H04W 16/02 | |
| 2018/0059142 A1* | 3/2018 | Cirillo | G01R 13/0236 | |
| 2018/0176898 A1* | 6/2018 | Yu | H04W 72/046 | |
| 2018/0267158 A1* | 9/2018 | Kishigami | G01S 13/288 | |
| 2018/0366815 A1* | 12/2018 | Rheinfelder | H04B 1/62 | |
| 2019/0000704 A1* | 1/2019 | Kumar | A61N 5/0621 | |

\* cited by examiner

METHOD FOR COMPRESSING IQ MEASUREMENT DATA

FIELD OF THE DISCLOSURE

Embodiments of the present disclosure relate generally to a method for compressing IQ measurement data obtained from a signal.

BACKGROUND

Baseband in-phase and quadrature data (IQ data) are the basis for radio frequency (RF) signal generation as well as radio frequency signal analysis. Given the trend in radio frequency applications towards higher bandwidths in general and in certain applications such as surveillance and/or data analysis towards longer record lengths, larger amounts of IQ data have to be stored and transferred. Accordingly, larger data storages as well as higher bandwidth capacities are required. Therefore, methods for compressing the IQ measurement data are of great interest wherein the respective methods also have to ensure a small deviation from the original signal when reconstructing the respective signal from the compressed IQ measurement data.

Typically, the IQ data are compressed based on the so-called μ-law compression. However, this approach effectively reduces the data fidelity of the digital data as a trade-off with reducing the number of bits required to store the respective data. Typically, compression ratios of 2:1 or 3:1 with acceptable loss of fidelity are achieved wherein an increase of 1% of the error vector magnitude (EVM) occurs.

In fact, the compression techniques used are based on retaining data in the most significant bits. However, the compression ratios achieved are not satisfying with respect to the increase in IQ data to be processed due to higher bandwidths and/or longer record lengths.

Accordingly, there is a need for a method for compressing IQ measurement data in a more effective way.

SUMMARY

Embodiments of the present disclosure provide a method for compressing IQ measurement data obtained from a signal, with the following steps:

determining, within the IQ measurement data, at least one block of IQ data where redundancy of the respective data can be exploited;

transforming the IQ data of the at least one block into a transform domain where redundancy of the respective data can be exploited;

determining transform coefficients obtained in the transform domain and assessing the transform coefficients with regard to a pre-defined criteria so as to determine whether the transform coefficients comprise significant information; and storing only the IQ data assigned to transform coefficients having significant information along with indices in the transform domain indicating where the respective transform coefficients occur in the transform domain.

Accordingly, the approach exploits redundancy, namely expandability or rather needlessness, of the IQ data in the respective transform domain so that the respective data compression can be improved. This approach is especially useful in cases where signals from which the respective IQ measurement data are obtained are either bursty in time, for instance pulsed radar signals or time divisional duplex (TDD) communication signals, or hopping in frequency such as frequency hopping radar signals, frequency hopping communication signals or frequency division duplex (FDD) communication signals. Hence, the storage requirement for that kind of signals mentioned above can be reduced significantly by the method according to the present disclosure.

Moreover, the transform domain may depend on the type of signal processed. Thus, the transform domain used for IQ measurement data compression may be selected from a set of different transform domains depending on the type of signal identified previously.

The respective transfer domain may be at least one of a time domain, a frequency domain and a time-frequency domain (also called spectrogram or rather spectrogram waterfall) so that the respective IQ data is transformed in a suitable transform domain depending on the type of signal processed as mentioned above. Thus, the respective signal, for example the IQ measurement data assigned to the signal, may be transformed into the frequency domain, for instance by applying a Fourier transform, or into a time domain for compressing the respective IQ measurement data appropriately.

Accordingly, the signal, for example the IQ measurement data obtained from the signal, is analyzed so as to determine a potential for redundancy in a certain transform domain, namely a time domain and/or a frequency domain. If a potential for redundancy is identified for a certain transform domain, the respective IQ data is transformed into this transform domain so as to exploit the redundancy of the respective data in this transform domain. Hence, the compression properties can be improved.

The indices stored along with the transform coefficients identified ensure that the respective positions of the transform coefficients within the transform domain are stored simultaneously. Hence, the transform coefficients can be located within the respective transform domain appropriately.

The overall IQ data obtained, which relates to the IQ measurement data, may be processed in different IQ data blocks. Furthermore, a transformation is applied to at least one of these blocks, for example each block of IQ data, to a dedicated transform domain where redundancy can be exploited for the respective IQ data block, for example for all IQ data blocks.

For instance a Fourier transform is used to exploit redundancy in the frequency domain.

The respective transform coefficients, also called transform domain coefficients, such as the frequency domain coefficients (Fourier coefficients) are known once the transform has been applied.

These transform coefficients may be assessed according to the pre-defined criteria that determines whether the respective transform coefficients is related to significant information or not. Hence, it can be evaluated whether or not the respective IQ data block, also called block of IQ data, contains significant information or not.

The significant information may relate to a power or at least a parameter corresponding to the power such that the transform coefficients are assessed whether or not they have a certain power level being pre-defined as being a significant one.

Afterwards, only the significant transform coefficients for each block, namely the transform coefficients identified as being significant due to the criteria used for assessing the IQ data, are stored along with the above-mentioned indices in the transform domain so as to indicate where the significant transform coefficients occur in the respective transform domain. For instance, significant (frequency) coefficients are stored for each block along with indices indicating where these (frequency) coefficients occur within the (frequency) domain used as the transform domain.

According to an aspect, the pre-defined criteria corresponds to at least one of an absolute power level, a relative power level, statistically significant portion of the total power level, and a physically significant quantity. The relative power level may be assigned to a percentage value of the signal energy such as an attenuation. Generally the pre-defined criteria may be a threshold value that is taken into account for assessing the transform coefficients obtained in the transform domain.

Besides the Fourier transform that is used to exploit redundancy in the frequency domain, XYZ transforms and/or wavelet transforms may also be used.

If all or nearly all transform coefficients are deemed to be significant, no compression is applied for the respective block of IQ data. Since the transform coefficient and the respective values are stored, compression makes only sense for blocks where a significant proportion of the transform coefficients are rejected as being not significant since the entire block is preserved elsewhere so that no compression is applied for this specific block of IQ data.

Further, the pre-defined criteria may be set by a user. The user may set the predefined criteria due to a physically significant quantity like the error vector magnitude (EVM) or signal-noise ratio (SNR). Thus, different threshold values may be used for the pre-defined criteria depending on a setting done by the user. In other words, the user sets a desired error vector magnitude (EVM) or signal-noise ratio (SNR) to be reached when decompressing the compressed IQ data wherein the respective pre-defined criteria is (e.g., automatically) set appropriately. The pre-defined criteria is applied when assessing the transform coefficients.

According to another aspect, for all transform coefficients not-retained, an average power value is calculated and stored along with the respective transform coefficients, namely the transform coefficients being not-retained. This average power value being calculated can be used later when the respective compressed data is decompressed.

For instance, a signal is reconstructed from the compressed IQ measurement data by applying an inverse transform so as to obtain decompressed IQ data. For each block, the respective compressed IQ data is restored by recreating the respective coefficient vector given the values and position from the compressed data.

According to another aspect, noise is generated during signal reconstruction with a power corresponding to an average power stored for all transform coefficients not-retained. Hence, a random signal corresponding to a noise may be generated with a power equal to the average power previously stored for the respective block at positions where no coefficient was stored since the respective coefficient was identified as having no significant information with regard to the pre-defined criteria previously applied during the compression.

In this way, a reconstructed signal corresponding to the (original) signal from which the IQ measurement data were obtained can be reconstructed having the same noise characteristic as the original signal.

For instance, a signal being transformed into the frequency domain by a Fourier transform can be transferred back to the time domain via an inverse transform of the Fourier transform applied in order to obtain the decompressed IQ data.

The noise may be generated by means of a random signal generator. The random signal generator generates a signal with a power corresponding to the average power as mentioned above.

According to another aspect, once the transform occurs, other compression techniques can be used. For example, difference coding from frame-to-frame is used so that only the position and at least one of the number and the value of unchanged frames are stored when at least one of position and value of a specific transform coefficient is unchanged with regard to the previous frame. Thus, further compression of the IQ measurement data can be achieved when the position and/or the value of a specific transform coefficient is unchanged since only the position and the number of the respective unchanged frames are stored instead of the respective transform coefficients.

Alternatively, the position, the value and the number of the unchanged frame are stored. A frame may relate at least to a part of the block of IQ data. For instance, only a changing value is stored so as to reduce the data to be stored further. Hence, the storage capacity required can be reduced significantly. When a signal only changes in amplitude, the respective changing value may only be stored so as to reduce the amount of information to be stored resulting in a reduction of data to be stored.

As another example, only an average value and the variation may be stored. Thus, further compression of the IQ measurement data can be ensured since the information to be stored is further reduced. The average value may be the one of a block of IQ data wherein the respective variation may take the significant transform coefficients into account.

The average value and the variation may be stored with a lower bit-depth so as to reduce the amount of data to be stored further. The bit-depth relates to the number of bits of information per sample. Thus, the bit-depth corresponds to the resolution.

For instance, the length of the at least one block of IQ data is variable. Hence, the blocks whose length is variable may be tuned appropriately for achieving the best compression ratio during the compression of the IQ measurement data.

Other compression such wherein adjacent coding exploiting spatial redundancy can be used either within an individual frequency domain block (spectrum), or in an overall data mapping of a waterfall spectrogram. The compression can be improved further. In fact, this compression may also be applied once the transform occurs.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
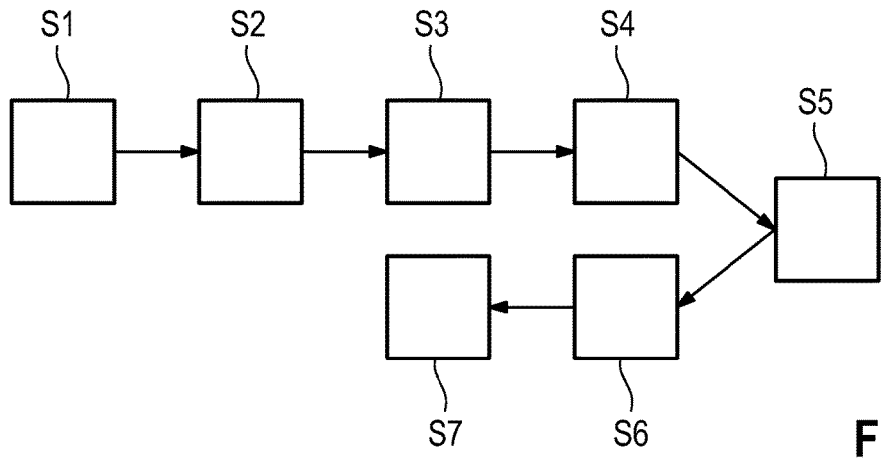
FIG. 1 schematically shows a flow-chart illustrating a representative method according to an aspect of the present disclosure.

FIG. 1 is a flow-chart that illustrates a method for compressing IQ measurement data obtained from a signal. In a first step (Step S1), at least one block of IQ data within the IQ measurement data obtained from the signal is determined wherein it is expected that redundancy could be exploited within this block in a certain domain such as time or frequency, for instance.

Afterwards, the respective IQ data of the at least one block is transformed into a transform domain (Step S2), for instance a time domain or rather a frequency domain. The respective transform domain is selected so that redundancy of the respective data can be exploited in this domain. Thus, the transform domain selected may depend on the type of signal. Hence, the type of signal may be determined previously.

After the IQ data of the respective block has been transformed into the transform domain, the respective transform coefficients obtained in the transform domain are determined and assessed with regard to a pre-defined criteria so as to determine whether the transform coefficients comprise significant information (Step S3).

The significant information may relate to a power or at least a parameter corresponding to the power such that the transform coefficients are assessed whether or not they have a certain power level being pre-defined as being a significant one.

Hence, the assessment of the transform coefficients may be done by comparing the respective transform coefficients, for example their power, with at least one of an absolute power level, a relative power level such as a percentage of signal energy and a physically significant quantity. The respective transform coefficients may therefore be compared with a threshold value that has been set by a user previously.

For instance, the user may set the pre-defined criteria depending on a physically significant quantity like the error vector magnitude (EVM) or a signal to noise ratio (SNR) previously. In other words, the user selects a desired error vector magnitude (EVM) or a signal to noise ratio (SNR) so that the pre-defined criteria applied for assessing the transform coefficients is set appropriately.

Once the respective transform coefficients have been assessed, the transform coefficients having significant information are stored along with indices in the transform domain indicating where the respective transform coefficients occur in the transform domain (Step S4). Hence, the respective transform coefficients or rather the IQ data assigned to the transform coefficients are stored as well as the locations or rather positions within the transform domain so that these transform coefficients or rather the IQ data related thereto can be reconstructed as will be described later.

For all transform coefficients that are not retained, an average value is calculated and stored along with the respective transform coefficients (Step S5). This information is also used for reconstruction as will be described later. In some embodiments, these steps may be repeated for all IQ data blocks, serially or in parallel.

Accordingly, compressed IQ data is obtained for the original signal that can be used for reconstructing a respective reconstructed signal by decompressing the compressed IQ data.

For further IQ data compression, a frame-to-frame approach may be applied so that only the position and the number of unchanged frames are stored when the position and/or value of a specific transform coefficient may be unchanged with regard to the previous frame. Hence, the position and the number of an unchanged frame are stored. Alternatively, the position, the value and the number of unchanged frames may be stored when the position and/or value of a specific transform coefficient may be unchanged with regard to the previous frame. The number of bits can be reduced appropriately.

Accordingly, further compression can be obtained when at least one of the specific transform coefficient position and a specific transform coefficient value is unchanged with respect to the previous frame as only a chancing value is stored so as to reduce the storage capacity required. For instance, frequency values may be disregarded for a signal only changing in amplitude.

Moreover, only an average value and a variation are stored so that the compression can be improved further. The respective average value and the variation may be stored with a lower bit-depth so that the compression is further improved. Accordingly, the overall amount of data can be reduced yielding a higher compression.

Generally, the length of the at least one block of IQ data that has been determined previously is variable so that the length of the at least one block can be adapted to the respective compression ratio intended. In fact, the compression ratio can be improved by adapting the length of the blocks of IQ data.

Once the IQ measurement data has been compressed appropriately, a signal can be reconstructed from the compressed IQ measurement data by applying an inverse transform so as to obtain the decompressed IQ data (Step S6).

The respective transform coefficients having significant information can be reconstructed easily as the respective information is stored in the compressed IQ measurement data, namely the respective transform coefficients. For the transform coefficients without significant information, namely the transform coefficients not-retained, noise is generated during signal reconstruction with a power that corresponds to an average power of the respective block of IQ data (Step S7). The average power may have been stored for all transform coefficients being not-retained as described earlier.

The noise may be generated by a random signal generator that generates a signal with a power corresponding to the average power.

In this way, a reconstructed signal corresponding to the original signal from which the IQ measurement data was obtained can be obtained that has noise characteristic corresponding to the original one.

Figure 2:
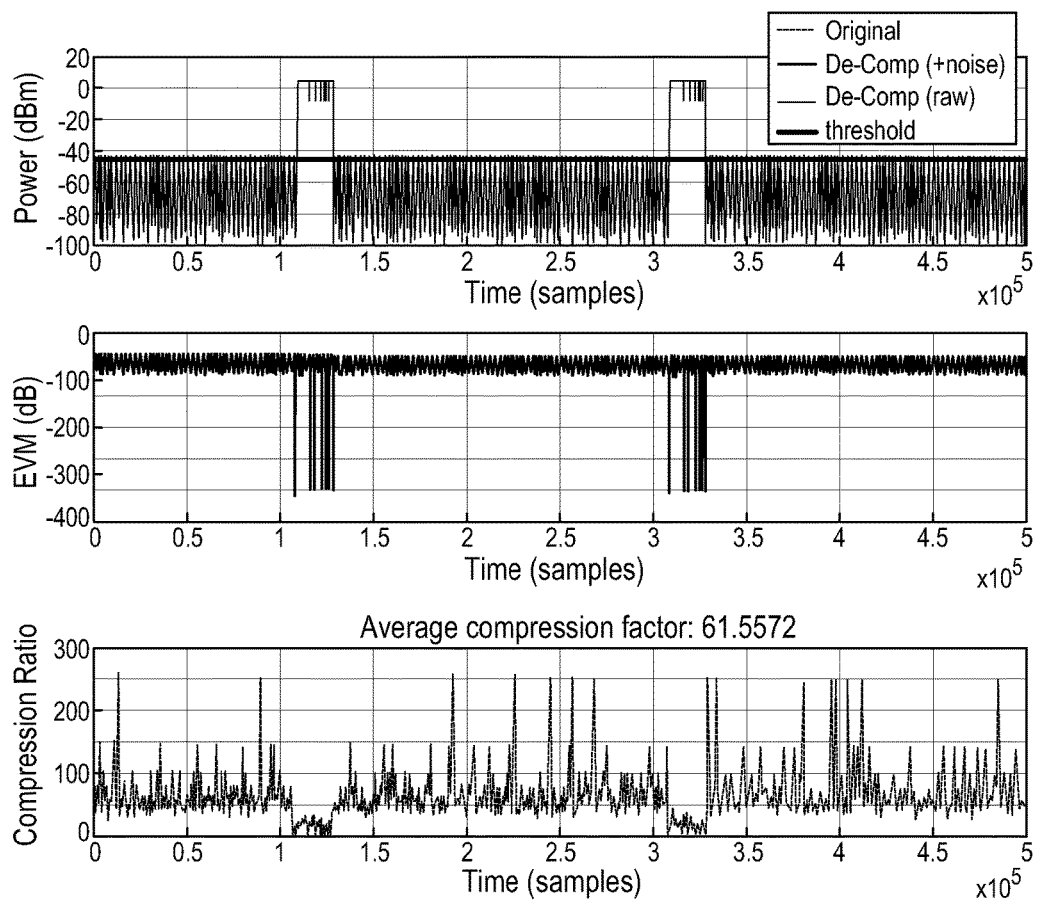
FIG. 2 shows an overview for a bursty signal illustrating the power, the error vector magnitude and the compression ratio.

Turning now to FIG. 2, a schematic overview is shown for an example wherein a representative method according to the present disclosure has been applied to a signal corresponding to a modulated pulse signal. The original data is compared with the decompressed data as well as the decompressed data including the simulated noise. Moreover, the error is indicated in terms of the error vector magnitude (EVM) which demonstrates that the decompressed data achieves the desired EVM threshold set for compression, namely about −50 dB. Nevertheless, a high average compression ratio of more than 60 can be achieved by applying the respective method as shown in the lower diagram of the overview. Hence, a very good compression ratio is achieved between the pulses of the modulated pulse signal where only noise occurs. Within each pulse, a mild compression is applied so as to ensure that the reconstructed signal has the desired error vector magnitude. Accordingly, high data compression can be ensured while having a low error vector magnitude (EVM).

Figure 3:
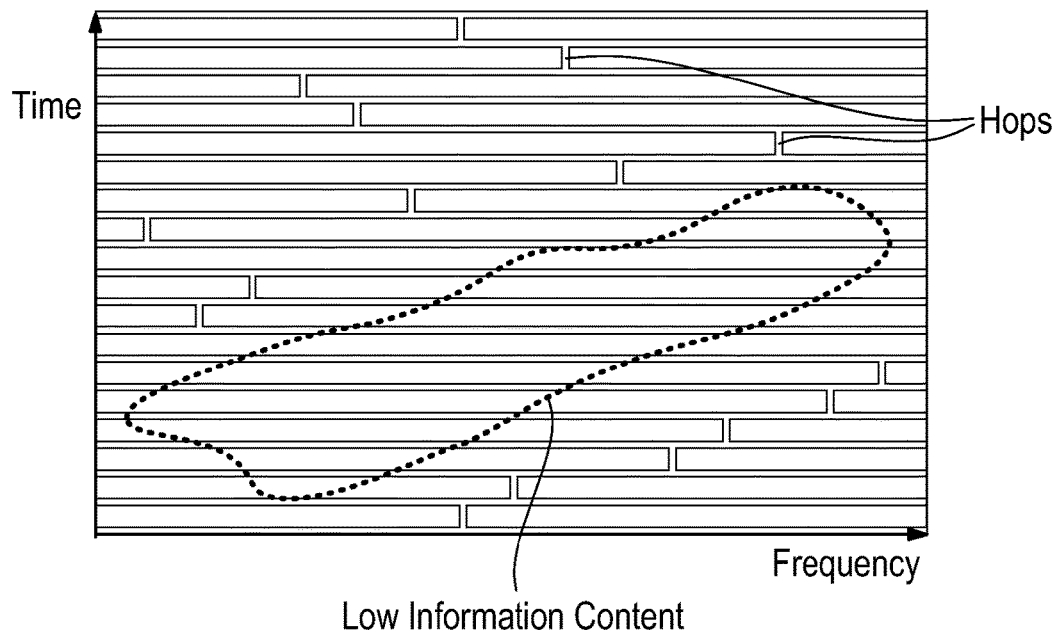
FIG. 3 shows an example of a spectrogram of a frequency hopping signal.
Figure 4:
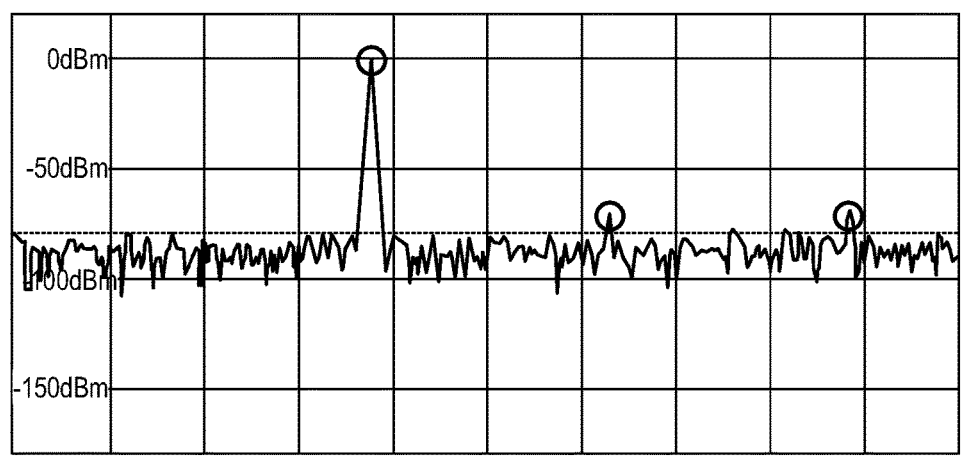
FIG. 4 shows an example of a block of IQ data transformed into a transform domain.
Figure 5:
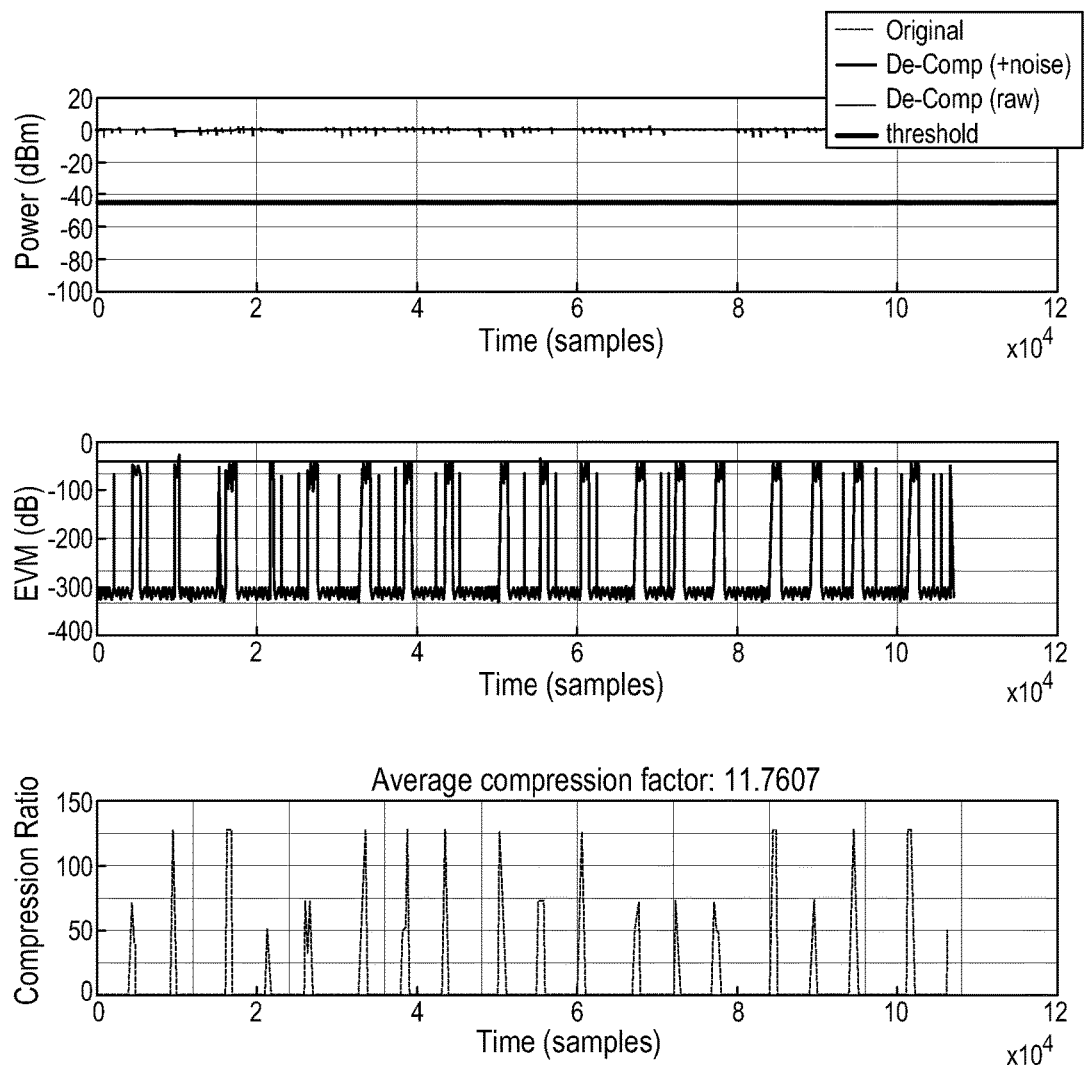
FIG. 5 shows an overview for a frequency hopping signal illustrating the power, the error vector magnitude and the compression ratio.

In FIGS. 3 to 5, another overview for an example is shown wherein the a representative method according to aspects of the present disclosure has been applied to a signal corresponding to a frequency hopping signal. For a frequency hopping signal, power is always transmitted so that no compression gain can be achieved in the time domain in contrast to the pulsed signal example shown in FIG. 2. However, the spectrogram of FIG. 3 indicates that there is significant redundancy in the frequency domain since only a single signal frequency is active at a given point in time. This frequency hopping is indicated as "hops" in FIG. 3. Hence, an area of low information occurs which is also illustrated in FIG. 3. Accordingly, redundancy can be exploited in this area so that a compression can be applied to the IQ data.

In the spectrogram of FIG. 3, each line is assigned to a Fourier transform of a single block of IQ data that is processed by the compression method according to the present disclosure in a manner as already described earlier. For each block of IQ data, a few significant transform coefficients only occur as can be seen from FIG. 4 indicating the Fourier transform of a single block of IQ data. Thus, large compression potential with low information loss is provided.

In the example of FIG. 4, only the three transform coefficients, the encircled ones, were identified as having significant information so that only these transform coefficients are retained. In some embodiments, a pre-defined criteria, namely a threshold value with regard to the power is applied, wherein these three transform coefficients exceed the respective pre-defined criteria. The threshold value is indicated by the dotted line in FIG. 4.

The pre-defined criteria may relate to an absolute power level, a relative power level and a physically significant quantity. The physically significant quantity may be set by the user. Further, the physically significant quantity may relate to a desired error vector magnitude (EVM) or rather signal-noise ratio (SNR) which is converted into a pre-defined criteria applied for assessing the respective transform coefficients. The other transform coefficients being assessed as having no significant information are not retained as mentioned above. Hence, an average power value related to the overall block of IQ data is calculated and stored along with the respective transform coefficients.

Once a signal is reconstructed from the compressed IQ data, the signal is reconstructed from the compressed IQ measurement data by applying an inverse transform so as to obtain decompressed IQ data. The transform coefficients with significant information can be decompressed in a known manner wherein noise is with a power corresponding to the average power stored is generated for all transform coefficients not-retained, namely the ones assessed as having no significant information. The noise may be generated by means of a random signal generator.

FIG. 5 reveals that the signal power of the reconstructed signal is relatively constant over the entire interval even though a compression factor of over 11 is achieved while retaining an error vector magnitude (EVM) of −50 dB.

The respective method, for example the compressing part thereof, may be applied for data acquisition equipment such as spectrum and signal analyzers, recording boxes and so on. In addition, the method, for example the decompressing part thereof, may be applied for data replay equipment such as a vector signal generator.

In some embodiments, embodiments of the methods described herein can be implemented in hardware, software, or a combination of hardware and software. For example, in some embodiments, one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, can be employed to carry out the embodiments of the methods described herein. In some of these embodiments, discrete digital or analog circuit elements or electronics, or combinations thereof may also be used.

In an embodiment, logic modules and/or instructions stored in memory can be executed by one or more microprocessors, processing units, etc., for implementing one or more embodiments described herein. In an embodiment, one or more ASICs having a plurality of predefined logic components implements one or more embodiments described herein. In an embodiment, one or more FPGA having a plurality of programmable logic components implements one or more embodiments described herein. In an embodiment, hardware circuit implementations (e.g., implementations in analog circuitry, implementations in digital circuitry, and the like, and combinations thereof) carry out the one or more methods described herein. In an embodiment, a combination of circuits and computer program products having software or firmware instructions stored on one or more computer readable memories work together to cause a device to perform one or more of the methods described herein The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for compressing IQ measurement data obtained from a signal, comprising:
    determining, within the IQ measurement data, at least one block of IQ data where redundancy of the respective data can be exploited;
    transforming the IQ data of the at least one block into a transform domain where redundancy of the respective data can be exploited, wherein the transform domain depends on the type of signal processed;

determining transform coefficients obtained in the transform domain and assessing the transform coefficients with regard to a pre-defined criteria so as to determine whether the transform coefficients comprise significant information; and storing only the IQ data assigned to transform coefficients having significant information along with indices in the transform domain indicating where the respective transform coefficients occur in the transform domain.

2. The method according to claim 1, wherein the transform domain is at least one of a frequency domain, a time domain, and a time-frequency domain.

3. The method according to claim 1, wherein the pre-defined criteria corresponds to at least one of an absolute power level, a relative power level and a physically significant quantity.

4. The method according to claim 1, wherein the pre-defined criteria is set by a user.

5. The method according to claim 1, wherein a signal is reconstructed from the compressed IQ measurement data by applying an inverse transform so as to obtain decompressed IQ data.

6. The method according to claim 5, wherein noise is generated during signal reconstruction with a power corresponding to an average power stored for all transform coefficients not-retained.

7. The method according to claim 6, wherein the noise is generated by a random signal generator.

8. The method according to claim 1, wherein, from frame-to-frame, only the position and at least one of the number and the value of unchanged frames are stored when at least one of position and value of a specific transform coefficient is unchanged with regard to the previous frame.

9. The method according to claim 1, wherein only a changing value is stored.

10. The method according to claim 1, wherein only an average value and the variation are stored.

11. The method according to claim 10, wherein the average value and the variation are stored with a lower bit-depth.

12. The method according to claim 1, wherein the length of the at least one block of IQ data determined is variable.

13. The method according to claim 1, wherein adjacent coding exploiting spatial redundancy is used either within an individual frequency domain block, or in the overall data mapping of a waterfall spectrogram.

14. The method of claim 1, wherein, for all transform coefficients not-retained, an average power value is calculated and stored along with the respective transform coefficients.

15. A method for compressing IQ measurement data obtained from a signal, comprising:
    determining, within the IQ measurement data, at least one block of IQ data where redundancy of the respective data can be exploited;
    transforming the IQ data of the at least one block into a transform domain where redundancy of the respective data can be exploited;
    determining transform coefficients obtained in the transform domain and assessing the transform coefficients with regard to a pre-defined criteria so as to determine whether the transform coefficients comprise significant information; and
    storing only the IQ data assigned to transform coefficients having significant information along with indices in the transform domain indicating where the respective transform coefficients occur in the transform domain,
    wherein, for all transform coefficients not-retained, an average power value is calculated and stored along with the respective transform coefficients.

16. A method for compressing IQ measurement data obtained from a signal, comprising:
    determining, within the IQ measurement data, at least one block of IQ data where redundancy of the respective data can be exploited;
    transforming the IQ data of the at least one block into a transform domain where redundancy of the respective data can be exploited;
    determining transform coefficients obtained in the transform domain and assessing the transform coefficients with regard to a pre-defined criteria so as to determine whether the transform coefficients comprise significant information, the significant information relating to a power or at least a parameter corresponding to the power such that the transform coefficients are assessed whether or not they have a certain power level being pre-defined as being a significant one, the pre-defined criteria corresponding to a threshold value with regard to the power; and
    storing only the IQ data assigned to transform coefficients having significant information along with indices in the transform domain indicating where the respective transform coefficients occur in the transform domain.

* * * * *